United States Patent [19]

Walls et al.

[11] Patent Number: 4,822,720

[45] Date of Patent: Apr. 18, 1989

[54] WATER DEVELOPABLE SCREEN PRINTING COMPOSITION

[75] Inventors: John E. Walls, Hampton; Frank C. Pagano, Avenel, both of N.J.

[73] Assignee: Hoechst Celanese Corporation, Somerville, N.J.

[21] Appl. No.: 65,076

[22] Filed: Jun. 16, 1987

Related U.S. Application Data

[63] Continuation of Ser. No. 762,080, Aug. 2, 1985, abandoned.

[51] Int. Cl.$^4$ .......................... G03F 7/12; G03C 1/94; G03C 1/70
[52] U.S. Cl. .................................. 430/284; 430/909; 430/288; 430/308; 430/271; 430/275; 522/26; 522/28; 522/908; 522/116
[58] Field of Search ............... 430/909, 288, 308, 284, 430/271, 275; 522/26, 28, 908, 116

[56] References Cited

U.S. PATENT DOCUMENTS 2,245,218  6/1941  Murray et al. ........................... 91/69
2,269,217  1/1942  McNally et al. ....................... 260/73
(List continued on next page.)

FOREIGN PATENT DOCUMENTS 1144804  4/1983  Canada ................................ 430/175
3954475  9/1983  Canada .
(List continued on next page.)

OTHER PUBLICATIONS

Kirk-Othmar, "Encyclopedia of Polymer Science & Technology", vol. 14, pp. 208-213 & 217-230, 1971.

*Primary Examiner*—Paul R. Michl
*Assistant Examiner*—Cynthia Hamilton
*Attorney, Agent, or Firm*—Richard S. Roberts

[57] ABSTRACT

This invention relates to a composition for use in a screen printing screen. More particularly, this invention relates to a screen printing composition comprising
(a) a binder resin having the general formula

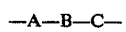

wherein a plurality of each of components A, B and C occur in ordered or random sequence in the resin and wherein A is present in said resin at about 5% to about 20% by weight and comprises groups of the formula

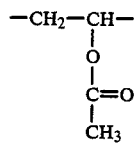

B is present in said resin at about 4% to about 30% by weight and comprises groups of the formula

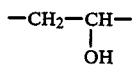

and C is present in said resin at about 50% to about 91% by weight and comprises acetal groups consisting of groups of the formulae

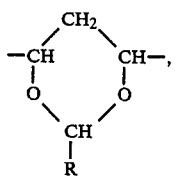 (I)

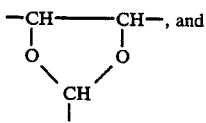

(II)

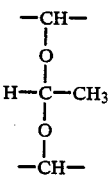

(III)

wherein said group I is present in component C from about 75% to about 85%; group II is present in component C from about 3% to about 5%; and group III is present in component C from about 10% to about 22%; and wherein R is hydrogen or lower alkyl; and
(b) a mixture of
 (1) a polyethoxylate diacrylated monomer; and
 (2) an oligomeric amine diacrylate; and
(c) a photoinitiator.

23 Claims, No Drawings

U.S. PATENT DOCUMENTS

| | | | |
|---|---|---|---|
| 2,278,895 | 4/1942 | Rugeley et al. | 28/1 |
| 2,405,523 | 8/1946 | Sease et al. | 430/176 |
| 3,390,993 | 7/1968 | Borchers | 96/36.4 |
| 3,396,019 | 8/1968 | Uhlig | 96/33 |
| 3,471,589 | 10/1969 | Rinehart | 260/839 |
| 3,514,421 | 5/1970 | Kershaw et al. | 260/29.6 |
| 3,552,965 | 1/1971 | Notley et al. | 96/48 |
| 3,653,902 | 4/1972 | Notley et al. | 96/49 |
| 3,679,419 | 7/1972 | Gillich | 96/91 R |
| 3,801,328 | 4/1974 | Takimoto et al. | 96/115 P |
| 3,847,614 | 11/1974 | Mattor | 96/75 |
| 3,867,147 | 2/1975 | Teuscher | 96/33 |
| 3,905,815 | 9/1975 | Bonham | 96/68 |
| 3,905,819 | 9/1975 | Sakurai et al. | 96/35.1 |
| 3,926,643 | 12/1975 | Chang | 430/288 |
| 3,926,918 | 12/1975 | Shibata et al. | 260/73 L |
| 3,954,475 | 5/1976 | Bonham et al. | 430/281 |
| 3,963,618 | 6/1976 | Muir | 526/9 |
| 4,002,796 | 1/1977 | Baldi et al. | 428/375 |
| 4,115,232 | 9/1978 | Nyi et al. | 522/28 X |
| 4,147,549 | 4/1979 | Held | 96/85 |
| 4,209,582 | 6/1980 | Merrill et al. | 430/308 |
| 4,228,232 | 10/1980 | Rosseau | 430/271 |
| 4,289,838 | 9/1981 | Rowe et al. | 430/163 |
| 4,316,949 | 2/1982 | Petrellis et al. | 430/159 |
| 4,387,151 | 6/1983 | Bosse et al. | 430/175 |
| 4,413,091 | 11/1983 | Iwasaki et al. | 430/195 X |
| 4,499,175 | 2/1985 | Curtis et al. | 430/308 X |

FOREIGN PATENT DOCUMENTS

| | | |
|---|---|---|
| 156015 | 6/1981 | Japan . |
| 078272 | 1/1982 | Japan . |
| 005910 | 11/1982 | Japan . |
| 196656 | 6/1983 | Japan . |
| 7410806 | 8/1974 | Netherlands . |
| 518757 | 7/1976 | U.S.S.R. . |
| 482731 | 6/1936 | United Kingdom . |
| 484476 | 5/1938 | United Kingdom . |
| 497146 | 12/1938 | United Kingdom . |
| 568914 | 4/1945 | United Kingdom . |
| 587797 | 5/1947 | United Kingdom . |
| 621784 | 4/1949 | United Kingdom . |
| 821092 | 9/1959 | United Kingdom . |
| 834337 | 5/1960 | United Kingdom . |
| 1352411 | 5/1974 | United Kingdom . |

WATER DEVELOPABLE SCREEN PRINTING COMPOSITION

This is a continuation of co-pending application Ser. No. 762,080, filed on Aug. 2, 1985, now abandoned.

BACKGROUND OF THE INVENTION

It is known to produce compositions for use in screen printing screens which are diazonium compound-sensitized polyvinyl alcohol/polyvinyl acetate emulsions. Such emulsions have several drawbacks in that the shelf life is so limited that they should be prepared as a two-component system and not mixed until immediately prior to usage. Besides the inconvenience of doing so, a further drawback is that unless the diazonium compound is thoroughly mixed into the emulsion, there may be uneven sensitization of the emulsion in that some areas are more heavily sensitized than others. In addition, depending upon the ratio of polyvinyl alcohol to polyvinyl acetate, the emulsion may be used with either solvent-based inks or water-based inks, but generally not with both.

It is desired to produce a composition for use in a screen printing screen which has a shelf life sufficient to allow it to be prepared as an one-component system. It is also desired to produce a composition for use in screen printing screen which is relatively insensitive to both water and a variety of organic solvents thus making it useful for a variety of inks, both waterbased and solvent-based, and which is relatively oxygen insensitive, elimating the need to expose a screen prepared with a protective barrier layer.

SUMMARY OF THE INVENTION

This invention relates to a composition for use in a screen printing screen. More particularly, this invention relates to a screen printing composition comprising (a) a binder having the general formula

—A—B—C— wherein a plurality of each of components A B and C occur in ordered or random sequence in the resin and wherein A is present in said resin at about 5% to about 20% by weight and comprises groups of the formula

B is present in said resin at about 4% to 30% by weight and comprises groups of the formula

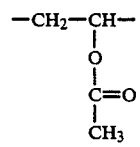

and C is present in said resin at about 50% to about 91% by weight and comprises acetal groups consisting of groups of the formulae

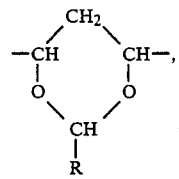 (I)

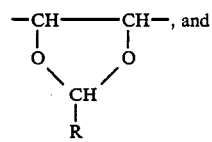 (II)

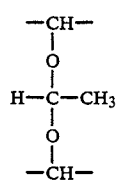 (III)

wherein said group I is present in component C from about 75% to about 85%; group Ii present in component C from about 3% to about 5%; and group III is present in component C from about 10% to 22%; and where R is hydrogen or lower alkyl; and (b) a mixture of
 (1) a polyethoxylate diacrylated monomer; and
 (2) an oligomeric amine diacrylate; and
(c) a photoinitiator.

DETAILED DESCRIPTION OF THE INVENTION

This invention relates to a composition which may be used in the preparation of a screen printing screen. This composition comprises a specific binder resin, a mixture of unsaturated compounds which are capable of undergoing free radical polymerization and a photoinitiator.

The binder resin suitable for use in this composition is (a) a binder having the general formula

—A—B—C— wherein a plurality of each of components A, B and C occur in ordered or random sequence in the resin and wherein A is present in said resin at about 5% to about 20% by weight and comprises groups of the formula

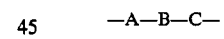

B is present in said resin at about 4% to 30% by weight and comprises groups of the formula

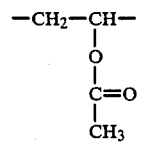

and C is present in said resin at about 50% to about 91% by weight and comprises acetal groups consisting of groups of the formulae

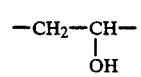

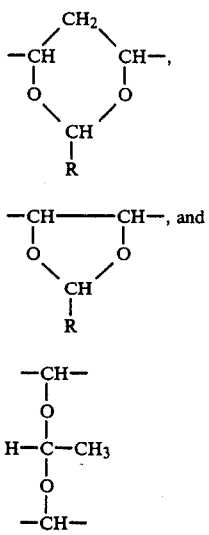

wherein said group I is present in component C from about 75% to about 85%; group II present in component C from about 3% to about 5%; and group III is present in component C from about 10% to 22%;

(b) a mixture of
(1) a polyethoxylate diacrylated monomer; and
(2) an oligomeric amine diacrylate;

(c) a photoinitiator

The polyvinyl alcohol/polyvinyl acetate copolymers useful as a starting material for the production of the resin useful in this invention are those having from about 75% to about 80% hydrolization by weight and, preferably, an average molecular weight (AMW) of from about 5,000 to about 100,000. As used in this application hydrolization is on a weight basis and not a mole basis. Such copolymers are easily synthesized by methods know to those skilled in the art, or are commercially available. Suitable copolymers include Vinol 523 (AMW≃70,000) and Vinol 205 (AMW≃26,000) available from Air Products co. of Allentown, Penna.; Elvanol 52-22 (AMW≃72,000) available from DuPont of Wilmington, Del.; and Gelvatol 20-30 (AMW≃10,000), Gelvatol 20-60 (AMW≃60,000), and Gelvatol 20-90 (AMW≃90,000) available from Monsanto Co. of St. Louis, Mo.

Because the resin is to be used in the production of screens for screen printing applications, the copolymers are preferably those having lower molecular weights (i.e. about 5,000 to about 30,000). Although these ranges are generally preferred, they are not critical.

In forming the resin useful in this invention, the copolymer is first dissolved in a solvent mixture of water and a hydroxyl group containing solvent. The hydroxyl group-containing solvent must be miscible with water, it must be a solvent for the copolymer, and it must be a solvent for the final product. Preferably, the hydroxyl group containing solvent is an aliphatic alcohol. Most preferably, the alcohol is one having from about 1 to 4 carbon atoms such as ethanol. In order to ensure that the copolymer molecules of the starting material are not so intertwined with each other nor have tertiary or quaternary structure to the extent that the reaction is interfered with to a substantial degree, the copolymer is preferably dissolved in the solvent mixture for at least 12 hours at elevated temperature (above 50° C.) before the reaction proceeds. This reaction mixture is then maintained at a temperature of at least 50° C. and mixed with vigorous agitation with continues throughout the reaction. Over a period of several hours, an aliphatic aldehyde is then titrated into the reaction mixture to form the acetal groups.

The process steps for preparing the foregoing resin include first dissolving a polyvinyl alcohol/polyvinyl acetate copolymer having from about 75% to about 80% hydrolization in a solvent mixture of water and a hydroxyl-group containing solvent to form a reaction solution. This is usually conducted for at least about 12 hours at a temperature of from about 20° C. to the boiling point of the solution depending on the molecular weight of the copolymer. The solution is then adjusted to at least about 50° C. while adding a catalytic amount, preferably from about 1.0% to about 1.5% by weight of an organic sulfonic or inorganic mineral acid. This is a catalytic amount of the acid and is insufficient to cause hydrolization. Titrated into the acidified mixture is an aliphatic aldehyde having the formula R—CHO, wherein R is hydrogen or lower alkyl. The aldehyde is added in an amount sufficient to produce a degree of acetal formation of from about 50% to about 91% by weight. During this titration an additional amount of said hydroxyl group containing solvent is added into said reaction mixture to prevent unwanted precipitation. Preferably one vigorously mixes said reaction mixture throughout the foregoing steps. Preferably the acid is then removed from the mixture by evaporation or the mixture is neutralized with an alkaline salt to a pH of from about 6.5 to 7.5 to quench said reaction mixture. One then effects precipitation of said reaction mixture; washes the precipitate with water; and dries the precipitate so as to have less than about 1% water residue.

Preferably the aldehyde is acetaldehyde. The amount of aldehyde titrated into the reaction mixture is preferably from about 25% to about 100% by weight of the copolymer. More preferably the amount of aldehyde is from about 28% to about 67% by weight of the copolymer.

As the acetal groups are formed at the expense of the hydroxyl content of the copolymer, the water solubility is reduced. In order to prevent premature precipitation of the product formed, additional amounts of the hydroxyl group containing solvent used in the solvent mixture are titrated simultaneously with the aldehyde to accomodate the reduced water solubility and increasing solvent solubility.

In order to properly form the acetal groups, a catalytic amount of an acid is required to be present during the titrations. Preferably the acid used is an inorganic acid or an organic sulfonic acid. Suitable inorganic acids include hydrochloric acid, sulfuric acid and phosphoric acid. Suitable organic sulfonic acids include p-toluene sulfonic acid and stilbene disulfonic acid. Most preferably, the acid catalyst is hydrochloric acid. The acid catalyst is preferably present in the reaction mixture in the amount of from about 1.0% to about 1.5% by weight of the total reaction mixture.

The reaction mixture is preferably, although not necessarily, cooled to room temperature (about 22° to 25° C.) and then may optionally be slowly mixed with water or other suitable compositions such as acetone or methyl ethyl ketone with continued vigorous agitation to effect precipitation. The resulting precipitate may be water washed to remove all remaining acid, aldehyde and unreacted copolymer, and is then warm air dried so as to have less than 1% water residue. The resin may be left in solution for use in the screen printing composition of this invention.

The resulting resin contains acetal groups consisting of three types: six-membered cyclic acetals which are present from about 75% to 85%, five-membered cyclic acetals which are present from about 3% to 5% and intermolecular acetals which are present from about 10% to 22%. It is important for the particular characteristics of this resin that all three types of acetal groups are present and in their indicated concentrations.

Preferably, the binder resin is present in the composition of this invention in the amount of about 28% to about 38% by weight. More preferably, the binder resin is present at about 30% to about 36% by weight, and, most preferably, it is present at about 32% to about 34% by weight. This resin is more fully described in U.S. patent application Ser. No. 762,089, filed on even date herewith, and which is incorporated herein by reference.

The mixture of unsaturated materials capable of undergoing free radical polymerization is comprised of a diacrylate monomer and an oligomeric amine diacrylate. Preferably, the mixture also contains a polyfunctional acrylate monomer and an oligomeric urethane acrylate.

The polyethoxylate diacrylated monomer suitable for use in the mixture is preferably a compound having the formula

and is referred to as polyethylene glycol 200 diacrylate, which can be prepared by methods known to those skilled in the art and which is available as Photomer 4050 from Diamond Shamrock Corporation of Morristown, N.J. The diacrylate monomer is preferably present in the screen printing composition of this invention in the amount of from about 14% to about 24% by weight and, more preferably, in the amount of from about 16% to about 23% by weight. Most preferably, the diacrylate monomer is present in the screen printing composition in the amount of from about 18% to about 21% by weight.

The oligomeric amine diacrylate suitable for use in the mixture is preferably a compund having the formula

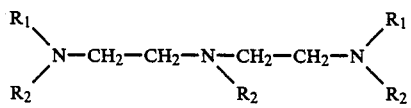

where $R_1$ is $CH_2=CH-\overset{O}{\underset{\|}{C}}-O-(CH_2)_n-$;

$n=0-4$ and $R_2$ is hydrogen, hydroxyl or $-(CH_2)_mOH$; $m=1-4$, which may be prepared by methods known to those skilled in the art and which is available as Celrad 7100 from Celanese Specialty Resins of Louisville, Kentucky. The oligomeric amine diacrylate is preferably present in the screen printing composition of this invention in the amount of from about 11.5% to about 24% by weight. More preferably, it is present in the amount of from about 16% to about 23% by weight, and, most preferably, the oligomeric amine diacrylate is present in the screen printing composition in the amount of from about 18% to about 21% by weight. It is preferred that the diacrylate monomer and the oligomeric amine diacrylate be present in the mixture in a ratio of about one-to-one.

One of the unique aspects of this invention is that the oligomeric amine diacrylate functions as both the oligomer in the photopolymer system and as the accelerator for the photoinitiator because it is a hydrogen donor due to the relatively high level of tertiary nitrogens.

As indicated, the mixture of unsaturated materials capable of undergoing free radical polymerization also preferably contains a multifunctional acrylic monomer and an oligomeric amine acrylate. Although not necessary, the addition of these two compounds provides increased strength and abrasion resistance to a screen prepared by using the composition of this invention.

The multifunctional acrylatic monomer which is preferably one having two or more unsaturated groups such as trimethylolpropane triacrylate, which may be prepared by methods known to those skilled in the art and is available as SR-351 from Sartomer Company of West Chester, Pennsylvania. More preferably, the polyfunctional acrylate monomer is the ethoxylated species, trimethylolpropane ethoxylate triacrylate, which also may be prepared by methods known to those skilled in the art and is available as Photomer 4149 from Diamond Shamrock Corporation and SR-454 from Sartomer Company. Other multifunctional acrylate monomers which may be employed in the mixture used in the composition of this invention include a hexafunctional polyester acrylate, available as Photomer 5007 from Diamond Shamrock Corporation, a tetrafunctional polyester acrylate, available as Photomer 5018 from Diamond Shamrock Corporation, pentaerythritol triacrylate, pentaerythritol tetraacrylate and dipentaerythritol monohydroxy pentacrylate. Each of the foregoing can be readily prepared by methods known to those skilled in the art. When used, the multifunctional acrylate monomer is present in an amount up to about 18% by weight. More preferably, the multifunctional acrylate monomer is present in an amount of from about 9% to about 16% by weight and, most preferably, about 10% to about 14% by weight.

The oligomeric urethane acrylate which may be used in the photopolymer mixture described herein is one having one or two unsaturated groups and which may or may not be a diacrylate and preferably has the formula

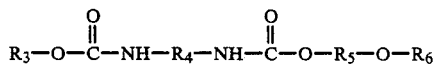

where $R_3 = R_6 = -\overset{O}{\underset{\|}{C}}-CH=CH_2$, and $R_4=R_5=C_6H_3R_7$ wherein $R_7=-CH_3$ or $-H$. Such compounds are readily prepared by methods known to those skilled in the art and are available as Purelast 155A from Polymer Systems Corporation of East Brunswick, N.J. When used, the oligomeric urethane acrylate is present in an amount of up to about 18% by weight. More preferably, it is present in an amount of from about 9% to about 16% by weight and, most preferably, the oligomeric urethane acrylate is present in an amount of from about 10% to about 14% by weight. It is preferred that the multifunctional acrylic monomer and the oligomeric urethane acylate, when used, be present in the photopolymer mixture in a ratio of about one-to-one.

In forming the composition of this invention, it is preferred that the ratio of binder resin to photopolymer mixture be about one-to-two.

The photoinitiator useful in preparing the composition of this invention is preferably a thioxanthone compound, most preferably 2-isopropyl-9H-thioxanthen-9-one, which may be prepared by methods known to those skilled in the art and is available as Quantacure ITX from Aceto Chemical Company of Flushing, N.Y. The photoinitiator is preferably present in the inventive composition in an amount of about 0.1% to about 1.0% by weight and, more preferably, about 0.2% to 0.8% by weight. Most preferably, the photoinitiator is present at about 0.2% to about 0.4% by weight.

In preparing the screen printing composition of this invention the photopolymer mixture and photoinitiator are dissolved in a suitable solvent to form a solution preferably comprising about 55% to 56% solids. Examples of solvents which may be used for this purpose include alcohols having from 1 to 4 carbons, gamma-butyrolactone, n-methyl pyrrolidone, and mixtures thereof of mixtures with water. Preferably, the solvent used is ethanol. The photopolymer mixture/ photoinitiator solution is then combined with the binder resin solution to give a clear viscous solution.

The fact that the composition of this invention is a solution is another advantageous aspect of this invention in that a solution has improved shelf life over the emulsions which are known in the art and does not require mixing by the end user.

In preparing a screen printing screen using the composition of this invention, a fabric having the desired thread diameter, mesh count, and composition is first stretched to the desired tension, preferably by mechanical or pneumatic means, over a suitable frame. Fabrics that may be used include polyester, nylon and stainless steel and frames which may be used may be made of wood or metal, especially aluminum. Once stretched, the fabric is attached to the frame with adhesives (when wood or metal frames are used), staples (when wood frames are used) or by mechanical means (when self-stretching frames are used). The thusly prepared screen is then degreased to remove dirt, dust and any grease or oils that may interfere with the adherence of the coating composition to the mesh.

The screen is then coated with the composition of this invention by one of a variety of means well known to those skilled in the art. For instance, the composition may be applied directly to both sides of the screen using a scoop coater or doctor blade in multiple coats and then dried; the composition may also be coated on a transfer sheet, dried, and then applied to the screen as a film, either before or after exposure and development; or a combination of these methods may be used.

After the composition of this invention is dried, it is exposed to ultraviolet light through a suitable photomask. The areas which are exposed become cured, thereby hardening them and rendering them water insoluble. The areas which are not exposed remain water-soluble. Development is preferably with a water spray which removes the unexposed areas.

The screen is then dried, blocked-out and prepared for printing as is known to those skilled in the art. The inks used may be either water-based, solvent-based or plastisols.

The following examples are illustrative of the invention which is understood not to be limited thereto.

EXAMPLE I 40 parts by weight of Vinol 523, a polyvinyl alcohol/-polyvinyl acetate copolymer which is 75% to 80% hydrolized by weight and which has an average molecular weight of 70,000, is dissolved in a mixture of 150 parts by weight of water and 120 parts by weight of n-propanol. The solution is heated to 70° C. and maintained at that temperature for 14 hours. The temperature is then reduced to 60° C. and 1.5 parts by weight of hydrochloric acid are added and 11.8 parts by weight of acetaldehyde are slowly titrated in with vigorous agitation, which continues for 6 hours to form the resin solution.

27.6 parts by weight of the resin solution (4.42 parts by weight of solids) is combined with 14.5 parts by weight of a stock solution which contains:

|  | Parts by weight |
|---|---|
| polyethylene glycol 200 diacrylate | 17.2 |
| Celrad 7100 | 17.2 |
| trimethylol propane triacrylate | 10.3 |
| Purelast 155A | 10.3 |
| 2-isopropyl-9H—thioxanthen-9-one | 0.2 |
| ethanol | 43.1 | to give a clear solution. This solution is then coated on a degreased, 305 mesh, dyed, monofilament polyester screen and dried. The screen is exposed to ultraviolet light through a photomask at 24 mJ/cm$^2$ using a 5 Kw mercury halide high pressure light source, after which it is developed with water. The resultant screen shows good resolution (4–5 mil lines) and abrasion resistance during printing.

EXAMPLE II 40 parts by weight of Gelvatol 20/30, a polyvinyl alcohol/polyvinyl acetate copolymer which 75% to 80% hydrolized by weight and which has an average molecular weight of 10,000 is dissolved in a mixture of 100 parts by weight of water and 80 parts by weight of n-propanol. The solution is heated to 70° C. and maintained at that temperature for 16 hours. The temperature is then reduced to 60° C. and 1.5 parts by weight of hydrochloric acid are added and 12.2 parts by weight of acetaldehyde are slowly titrated in with vigorous agitation which continues for 6 hours to form the resin solution.

19.6 parts by weight of the resin solution (4.37 parts by weight of solids) are combined with 14.5 parts by weight of the stock solution described in Example I to give a clear solution. This solution is then cooled on a degreased, 305 mesh, dyed, monofilament polyester screen and dried. The screen is exposed in a like manner as Example I and developed with water. The resultant screen shows good resolution (4–5 mil lines).

EXAMPLE III

As a comparative example 40 parts by weight of a polyvinyl alcohol/polyvinyl acetate copolymer which is 75% to 80% hydrolized by weight and which has an average molecular weight of 70,000 is dissolved in a mixture of 100 parts by weight of water and 160 parts by weight of n-propanol. The solution is heated to 70° C. and maintained at that temperature for 16 hours. The temperature is then reduced to 60° C. and 15.4 parts by weight of propionaldehyde are slowly titrated in 1.5 parts by weight of hydrochloric acid are added and with vigorous agitation for 5 hours. An additional 50 parts by weight of water and 80 parts by weight of n-propanol are then added to reduce the viscosity.

35.1 parts by weight of the solution described above (6.14 parts by weight of solids) is then combined with 14.5 parts by weight of the stock solution of Example I. The resultant solution is then coated onto a degreased 305 mesh, dyed, monofilament polyester screen and dried. The screen is exposed in like manner as in Example I, but cannot be developed with water.

EXAMPLE IV

As a comparative example 40 parts by weight of a polyvinyl alcohol/polyvinyl acetate copolymer which is 75% to 80% hydrolized by weight and which has an average molecular weight of 26,000 is dissolved in a mixture of 150 parts by weight of water and 120 parts by weight of n-propanol. The solution is heated to 70° C. and maintained at that temperature for 14 hours. The temperature is then reduced to 60° C. and 1.5 parts by weight of hydrochloric acid are added and 11.8 parts by weight of formaldehyde are slowly titrated in with vigorous agitation for 6 hours to form the resin solution.

21.2 parts by weight of the resin solution (4.42 parts by weight of solids) are combined with 14.5 parts by weight of the stock solution of Example I, resulting in a gel which is unusable.

EXAMPLE V

As a comparative example 40 parts by weight of a polyvinyl alcohol/polyvinyl acetate copolymer which is 75% to 80% hydrolized and which has an average molecular weight of 10,000 is dissolved in a mixture of 150 parts by weight of water and 120 parts by weight of n-propanol. The solution is heated to 70° C. and maintained at that temperature for 14 hours. The temperature is then reduced to 60° C. and 1.5 parts by weight of hydrochloric acid are added and 11.8 parts by weight of caprylaldehyde are slowly titrated in with vigorous agitation for 5 hours to form the resin solution.

16.4 parts by weight of the resin solution (4.42 parts by weight of solids) are combined with 20.75 parts by weight of a stock solution which contains

|  | parts by weight |
| --- | --- |
| polyethylene glycol 200 diacrylate | 19.3 |
| Celrad 7100 | 19.3 |
| 2-isopropyl-9H—thioxanthen-9-one | 1.2 |
| ethanol | 52.4 | to give a clear solution. The resulting solution is coated on a degreased, 305 mesh, dyed, monofilament polyester screen and dried. The screen is then exposed in like manner as Example I but cannot be developed with water.

EXAMPLE VI

As a comparative example 20 parts by weight (4.37 parts by weight of solids) of the resin solution of Example II is combined with 14.5 parts by weight of a stock solution which contains

|  | parts by weight |
| --- | --- |
| polyethylene glycol 200 diacrylate | 17.5 |
| Celrad 7100 | 17.5 |
| trimethylol propane triacrylate | 10.5 |
| Purelast 155A | 10.5 |
| benzophenone | 1.76 |
| ethanol | 43.9 |

The resulting solution is then coated onto a degreased, 305 mesh, dyed, monofilament polyester screen and dried. The screen is then exposed in like manner as Example I. Development of the screen with water gives no visible image followed by washout of both exposed and unexposed areas.

EXAMPLE VII 40 parts by weight of Vinol 523 is dissolved in a mixture of 135 parts by weight of water and 135 parts by weight of n-propanol. The solution is heated to 70° C. and maintained at that temperature for 14 hours. The temperature is then reduced to 60° C. and 1.5 parts by weight of hydrochloric acid are added and 11.8 parts by weight of acetaldehyde are slowly titrated in with vigorous agitation, which continues for 6 hours to form the resin solution. A portion of this solution is dried as a thin film in an exhaust hood overnight (approximately 16 hours) and then in a 55° C. vacuum oven.

5.0 parts by weight of the resulting film (assuming 80% solids) is dissolved in a mixture of 11 parts by weight of water and 11 parts by weight of n-propanol. This solution is then combined with a stock solution which contains

|  | parts by weight |
| --- | --- |
| polyethylene glycol 200 diacrylate | 17.2 |
| Celrad 7100 | 17.2 |
| trimethylol propane ethoxylate triacrylate | 10.3 |
| Purelast 155A | 10.3 |
| 2-isopropyl-9H—thioxanthen-9-one | 1.7 |
| ethanol | 43.1 | to form a solution.

The resulting solution is then coated on a degreased, 305 mesh, dyed, monofilament polyester screen and dried. The screen is exposed in a NuArc flip-top platemaker equipped with a soft rubber blanket to allow for exposure of screens in a vacuum. The screen is exposed for 100 units through an autotype exposure calculator which allows for exposures of 1.0, 0.7, 0.5, 0.33 and 0.25 times full exposure on one screen. The exposed screen is developed with water to give a screen with good resolution (4–5 mil lines). Based on the use of the exposure calculator, the optimum exposure is less than 25 units.

EXAMPLE VIII

As a comparative example 20 parts by weight of the resin solution from Example II (4.37 parts by weight of solids) is combined with 14.5 parts by weight of a stock solution which contains

|  | parts by weight |
| --- | --- |
| polyethylene glycol 200 diacrylate | 24.8 |
| trimethylol propane triacrylate | 15.2 |
| Purelast 155A | 15.2 |
| 2-isopropyl-9H—thoxanthen-9-one | 1.7 |

-continued

| | parts by weight |
|---|---|
| ethanol | 43.1 |

This solution is then coated on a degreased, 305 mesh, dyed, monofilament polyester screen and dried. The screen is exposed in like manner as Example I. Development of the screen with water produces a very faint image followed by wash-out of both exposed and unexposed areas, thus demonstrating the need for the oligomeric amine diacrylate component.

EXAMPLE IX 80 parts by weight of a polyvinyl alcohol/polyvinyl acetate copolymer which is 75% to 80% hydrolized by weight and which has an average molecular weight of 10,000 is dissolved in a mixture of 200 parts by weight of water and 160 parts by weight of n-propanol. The solution is heated to 70° C. and that temperature is maintained for 16 hours. The solution is then cooled to 60° C. and 1.5 parts by weight of hydrochloric acid are added and 24.3 parts by weight of acetaldehyde are slowly titrated in with vigorous agitation for 5 hours. A portion of the resin solution is dried as a thin film in like manner as Example V.

4.5 parts by weight of this material (4.0 parts by weight of solids) is dissolved in a mixture of 11.0 parts by weight of water and 11.0 parts by weight of n-propanol and combined with 14.5 parts by weight of a stock solution which contains

| | parts by weight |
|---|---|
| polyethylene glycol 200 diacrylate | 27.6 |
| Celrad 7100 | 27.6 |
| 2-isopropyl-9H—thioxanthen-9-one | 1.7 |
| ethanol | 43.1 | to give a clear solution, which is then coated on a degreased, 305 mesh, dyed, monofilament polyester screen and dried. The screen is exposed in a NuArc flip-top platemaker through an autotype exposure calculator. The screen is then developed with water to remove the unexposed areas to give a screen with good resolution (4–5 mil lines).

We claim:

1. A screen printing article comprising a fabric, having disposed thereon a composition comprising (a) a binder resin having the general formula

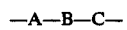

wherein of plurality of each of components A, B and C occur in ordered or random sequence in the resin and wherein A is present in said resin at about 5% to about 20% by weight and comprises groups of the formula

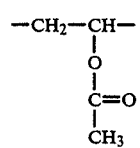

B is present in said resin at about 4% to about 30% by weight and comprises groups of the formula

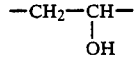

and C is present in said resin at about 50% to about 91% by weight and comprises acetal groups consisting of groups of the formulae

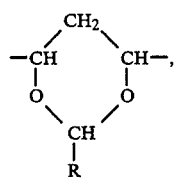 (I)

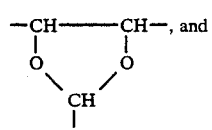 (II)

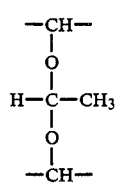 (III)

wherein said group I is present in component C from about 75% to about 85%; group II is present in component C from about 3% to about 5%; and group III is present in component C from about 10% to at 22%;

(b) a photopolymerizable mixture of
   (1) a polyethoxylate diacrylated monomer;
   (2) an oligomeric amine diacrylate and wherein R is hydrogen or lower alkyl; and (c) a photoinitiator.

2. The screen printing article of claim 1 wherein said photopolymerizable mixture further comprises a multifunctional acrylate monomer having two or more unsaturated groups, and an oligomeric urethane acrylate having one or two unsaturated groups.

3. The screen printing article of claim 1 wherein said diacrylate monomer has the formula

4. The screen printing article of claim 1 wherein said oligomeric amine diacrylate has the formula

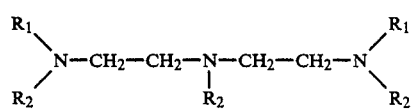

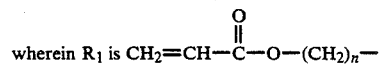

where $n=0-4$; and $R_2$ is hydrogen, hydroxyl o $-(CH_2)_mOH$ where $m=1-4$.

5. The screen printing article of claim 2 wherein said multifunctional acrylate monomer is trimethylolpropane ethoxylate triacrylate.

6. The screen printing article of claim 2 wherein said oligomeric urethane acrylate has the formula

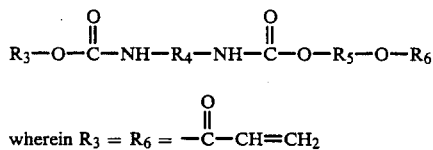

wherein $R_3 = R_6 = -\overset{O}{\underset{\|}{C}}-CH=CH_2$ and $R_4=R_5=C_6H_3R_7$ wherein $R_7=-CH_3$ or $-H$.

7. The screen printing article of claim 1 wherein said photoinitiator is a thioxanthone compound.

8. The screen printing article of claim 7 wherein said thioxanthone compund is 2-isopropyl-9H-thioxanthen-9-one.

9. The screen printing article of claim 1 wherein said binder resin is present at from about 8% to about 18% by weight.

10. The screen printing article of claim 9 wherein said binder resin is present at from about 10% to about 12% by weight.

11. The screen printing article of claim 1 wherein said diacrylate monomer is present at from about 4% to about 14% by weight.

12. The screen printing article of claim 11 wherein said diacylate monomer is present at from about 5% to about 7% by weight.

13. The screen printing article of claim 1 wherein said oligomeric amine diacrylate is present at from about 1.5% to about 14% by weight.

14. The screen printing article of claim 13 wherein said oligomeric amine diacrylate is present at from about 5% to about 7% by weight.

15. The screen printing article of claim 2 wherein said multifunctional acrylate monomer is present at up to about 12% by weight.

16. The screen printing article of claim 15 wherein said multifunctional acrylate monomer is present at from about 2% to about 4% by weight.

17. The screen printing article of claim 2 wherein said oligomeric urethane acrylate is present at up to about 12% by weight.

18. The screen printing article of claim 17 wherein said oligomeric urethane acrylate is present at from about 2% to about 4% by weight.

19. The screen printing article of claim 7 wherein said tioxanthone compound is present at from about 0.2% to about 1.0% by weight.

20. The screen printing article of claim 19 wherein said thioxanthone compound is present at from about 0.5% to about 0.7% by weight.

21. A screen printing article comprising a fabric, having disposed thereon a composition comprising (a) a binder resin having the general formula

—A—B—C— wherein a plurality of each of components A, B and C occur in ordered or random sequence in the resin and wherein A is present in said resin at about 5% to about 20% by weight and comprises groups of the formula

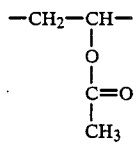

B is present in said resin at about 4% to about 30% by weight and comprises groups of the formula

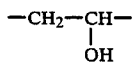

and C is present in said resin at about 50% to about 91% by weight and comprises acetal groups consisting of groups of the formulae

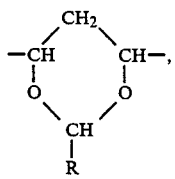 (I)

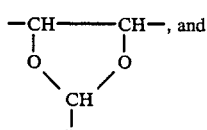 (II)

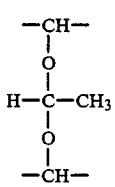 (III)

wherein said group I is present in component C from about 75% to about 85%; group II is present in component C from about 3% to about 5%; and group III is present in component C from about 10% to about 22%;

(b) a mixture of (1) a polyethoxylate diacrylated monomer having the formula

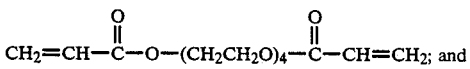

(2) an oligomeric amine diacrylate having the formula

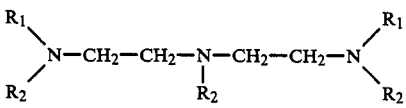

wherein $R_1$ is

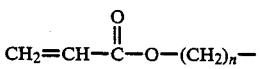

where n=0-4; and wherein R is hydrogen or lower alkyl; and and $R_2$ is hydrogen, hydroxyl or $-(CH_2)_mOH$ where m=1-4; and (3) trimethylolpropane ethoxylate triacrylate; and
(4) an oligomeric urethane acrylate having the formula

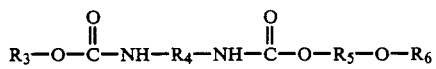

wherein $R_3 = R_6 = $ 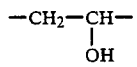, $R_4 = R_5 = C_6H_3R_7$ where $R_7 = -CH_3$ or $-H$; and (c) 2-isopropyl-9H-thioxanthen-9-one.

22. A method for preparing a screen printing article which comprises providing a composition which is a solution, which solution comprises components (a), (b) and (c) and coating a fabric with the composition which comprises:

(a) a binder resin having the general formula

—A—B—C— wherein of plurality of each of components A, B and C occur in ordered or random sequence in the resin and wherein A is present in said resin at about 5% to about 20% by weight and comprises groups of the formula

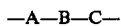

B is present in said resin at about 4% to about 30% by weight and comprises groups of the formula

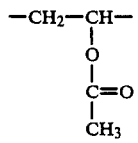

and C is present in said resin at about 50% to about 91% by weight and comprises acetal groups consisting of groups of the formulae

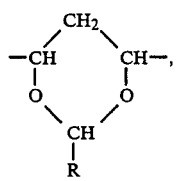 (I)

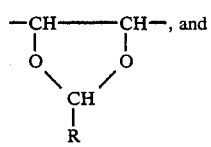, and (II)

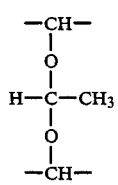 (III)

wherein said group I is present in component C from about 75% to about 85%; group II is present in component C from about 3% to about 5%; and group III is present in component C from about 10% to about 22%; and wherein R is hydrogen or lower alkyl, and (b) a photopolymerizable mixture of
(1) a polyethoxylate diacrylated monomer
(2) an oligomeric amine diacrylate; and
(c) a photoinitiator; and
subsequently imagewise exposing the composition to actinic radiation and developing with water alone.

23. The method of claim 22 wherein said fabric comprises one or more materials selected from the group consisting of polyester, nylon and stainless steel.

* * * * *